United States Patent [19]

Ema

[11] Patent Number: 4,961,165
[45] Date of Patent: Oct. 2, 1990

[54] SEMICONDUCTOR MEMORY DEVICE HAVING A CHARGE BARRIER LAYER FOR PREVENTING SOFT ERROR

[75] Inventor: Taiji Ema, Kawasaki, Japan
[73] Assignee: Fujitsu Limited, Kawasaki, Japan
[21] Appl. No.: 269,689
[22] Filed: Nov. 10, 1988

[30] Foreign Application Priority Data

Nov. 17, 1987 [JP] Japan .................................. 62-288512

[51] Int. Cl.⁵ ...................... G11C 11/34; H01L 29/78
[52] U.S. Cl. .................................... 365/182; 365/149;
365/156; 365/185; 357/23.3; 357/23.6; 437/52;
148/DIG. 148
[58] Field of Search ................ 365/149, 156, 182, 185;
357/23.6, 23.3, 23.12, 23.11; 437/52, 29, 60, 41;
148/DIG. 148, 52

[56] References Cited

U.S. PATENT DOCUMENTS

| 4,506,436 | 3/1985 | Bakeman, Jr. et al. | ........ 357/23.6 X |
| 4,644,386 | 2/1987 | Nishizawa et al. | ............ 357/23.3 X |
| 4,763,181 | 8/1988 | Tasch, Jr. | .............................. 365/185 |

FOREIGN PATENT DOCUMENTS

| 57-188866 | 11/1982 | Japan | .................................. 365/182 |
| 58-107667 | 6/1983 | Japan . | |
| 58-209164 | 12/1983 | Japan . | |
| 60-113462 | 6/1985 | Japan . | |
| 62-12152 | 1/1987 | Japan . | |
| 62-142362 | 6/1987 | Japan . | |

Primary Examiner—Stuart N. Hecker
Assistant Examiner—Alfonso Garcia
Attorney, Agent, or Firm—Staas & Halsey

[57] ABSTRACT

A semiconductor memory device includes a semiconductor substrate having source and drain regions each having a conduction type opposite to that of the semiconductor substrate, an insulation film formed on a main surface of the semiconductor substrate having first and second contact windows, and a gate electrode formed on the insulation film so as to be located between the source and drain regions. The semiconductor substrate has a charge barrier layer which has the same conduction type as the semiconductor substrate and which has an impurity concentration higher than that of the semiconductor substrate. The charge barrier layer is formed so that a depth ($d_1$) of the charge barrier layer located under the gate electrode measured from the main surface of the semiconductor substrate is smaller than a depth ($d_2$) of the charge barrier layer located under the source and drain regions measured from the main surface of the semiconductor substrate.

6 Claims, 7 Drawing Sheets

SEMICONDUCTOR MEMORY DEVICE HAVING A CHARGE BARRIER LAYER FOR PREVENTING SOFT ERROR

BACKGROUND OF THE INVENTION

The present invention generally relates to a semiconductor memory device having a charge barrier layer and a method for producing the same, and more particularly, to improvements in the charge barrier layer.

Recently, there has been considerable activity in the development of a dynamic random access memory (DRAM) device having an increased integration density. It is required particularly to reduce the size of an area of a memory cell which occupies a semiconductor chip. Therefore, there is a tendency for a memory capacitor to be reduced.

It is known that α-particles-induced soft errors increase with a decrease in size of the memory capacitor. Soft errors refer to a random failure not related to a physically defective device. When α-particles entires the semiconductor substrate, electron-hole pairs are generated. Holes move toward an electrode on the semiconductor substrate. On the other hand, electrons are diffused while some electrons are recombined with holes, and are collected in a depletion region under a gate electrode, a source region or a drain region. Further, electrons are collected in the source or drain region. The electrons captured in the depletion region or the source or drain region cause an erroneous operation of DRAM devices. The influence of α-particles is also a problem in a static random access memory device (SRAM device).

In order to suppress the occurrence of soft errors, various proposals have been reported. A proposal teaches an increase of the impurity concentration in a silicon semiconductor substrate. Another proposal teaches a $p^+$-type impurity diffusion region formed in a semiconductor substrate so as to be positioned below $n^+$-type diffusion regions such as source and drain regions formed in the semiconductor substrate. The $p^+$-type impurity diffusion region functions as a charge barrier layer for preventing electrons arising from the movement of α-particles in the semiconductor substrate, from being collected in the depletion regions, and source and drain regions. The $p^+$-type charge barrier layer is described in the Japanese Laid-Open Patent Application No. 58-107667, which corresponds to the U.S. patent application Ser. No. 333,230, now U.S. Pat. No. 4,506.436.

However, the prior art disclosed in the above paper has disadvantages as follows. The charge barrier layer is formed at the same depth from various points on the main surface of the substrate. Therefore, a vertical width of a depletion region formed under the impurity diffusion region such as source and drain regions is not identical to a vertical width of a depletion region of a channel under the gate electrode located between the source and drain regions. As a result, a portion of the charge barrier layer with respect to the depletion regions formed under the source and drain regions is different in charge collecting ability from a portion of the charge barrier layer with respect to the depletion region under the gate electrode. Normally, the charge barrier layer is formed at an optimum depth determined based on a vertical width of the depletion region under the source or drain region. In this case, since the depletion region under the gate electrode is unnecessarily wide in the vertical (depth) direction of the substrate, the $p^+$-type diffusion region cannot provide a sufficient function of preventing charges (electrons) due to α-particles from being collected in the depletion region under the gate electrode and the source and drain regions. It is noted that an increased vertical width of the depletion region has the increased ability of capturing electrons due to α-particles. Further, in the above case, the charge barrier layer hardly functions with respect to electrons generated due to oblique incidence of α-particles. On the other hand, if the charge barrier layer is formed at an optimum depth determined based on a vertical width of the depletion region under the gate electrode, the vertical width of the depletion region under the source or drain region exceeds a peak of an impurity concentration of the $p^+$-type charge barrier layer.

SUMMARY OF THE INVENTION

It is therefore a general object of the present invention to provide a novel and useful semiconductor device having a charge barrier layer and a method for producing the same in which the aforementioned disadvantages are eliminated.

A more specific object of the present invention is to provide a semiconductor device having a charge barrier layer capable of effectively preventing electrons induced by α-particles from being collected in depletion regions and highly doped regions such as source and drain regions.

The above objects of the present invention can be achieved by a semiconductor device having a charge barrier layer which includes a semiconductor substrate having source and drain regions each having a conduction type opposite to that of the semiconductor substrate, an insulation film formed on a main surface of the semiconductor substrate having first and second contact windows, and a gate electrode formed on the insulation film so as to be located between the source and drain regions. The semiconductor substrate has a charge barrier layer which has the same conduction type as the semiconductor substrate and which has an impurity concentration higher than that of the semiconductor substrate. The charge barrier layer is formed so that a depth ($d_1$) of the charge barrier layer located under the gate electrode measured from the main surface of the semiconductor substrate is smaller than a depth ($d_2$) of the charge barrier layer located under the source and drain regions measured from the main surface of the semiconductor substrate.

Another object of the present invention is to provide a method for producing the above semiconductor device.

The above another object of the present invention can be achieved by a method which includes the steps of forming an insulation film on a main surface of a semiconductor substrate; forming a gate electrode on the insulation film, the gate electrode having the conduction type opposite to that of the semiconductor substrate; implanting first impurity ions into the semiconductor substrate through the entire main surface thereof, the first impurity ions having a conduction type identical to that of the semiconductor substrate and having an impurity concentration higher than that of the semiconductor substrate, whereby the charge barrier layer is formed so that a depth ($d_1$) of the charge barrier layer located under the gate electrode measured from the main surface of the semiconductor substrate is smaller than a depth ($d_2$) of the charge barrier layer located under source and drain regions measured from the main surface of the semiconductor substrate; and implanting second impurity ions into the semiconductor substrate so as to form the source and drain regions located on both sides of the gate electrode. The second impurity ions have the conduction type opposite to that of the first impurity ions.

Other objects, features and advantages of the present invention will become apparent from the following detailed description when read in conjunction with the accompanying drawings.

DETAILED DESCRIPTION

Figure 1:
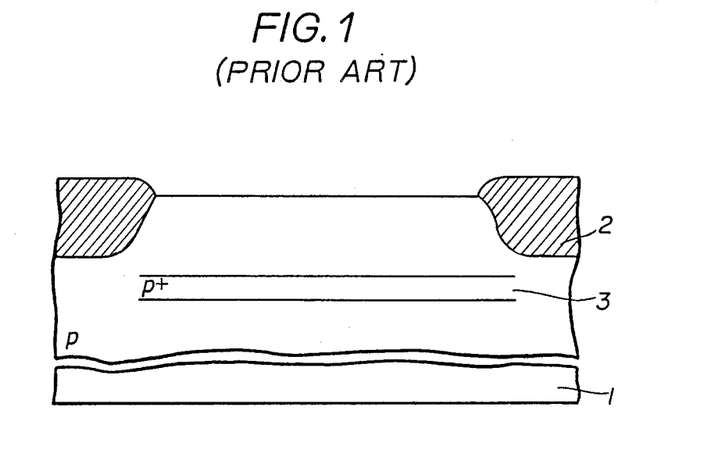
FIGS. 1 and 2 are cross sectional views at different steps of a conventional DRAM manufacturing process.
Figure 2:
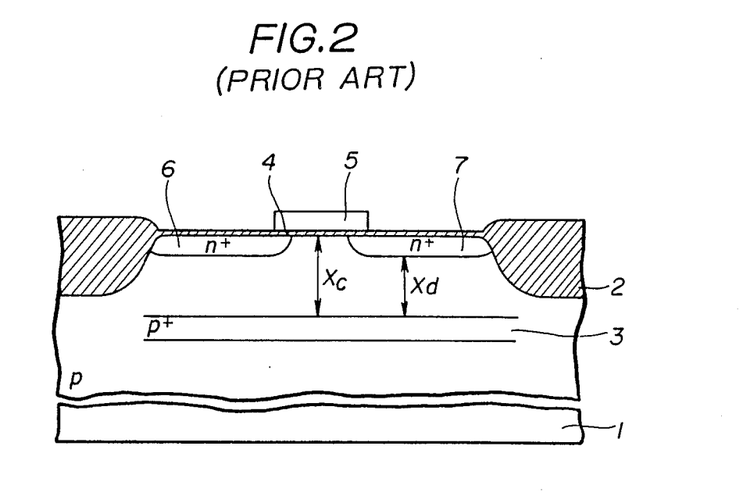

Before describing the embodiment of the present invention, a description is given of a conventional DRAM semiconductor device having a charge barrier layer and a method for producing the same, with reference to FIGS. 1, 2 and FIGS. 3A and 3B. The following description with respect to FIGS. 1 through 3 is described in the Japanese Laid-Open Patent Application No. 58-107667, which corresponds to the U.S. patent application Ser. No. 333,230.

Referring to FIG. 1, a field insulation film 2 of silicon dioxide is formed on a main surface of a p-type silicon semiconductor substrate 1 by a selective thermal oxidation process in which an oxidation-resistant mask film (not shown) such as a silicon nitride film is used. Next, the silicon nitride film is removed in its entirety so as to expose the surface of the silicon substrate 1, or a surface of an active region. Then a $p^+$-type charge barrier layer 3 is formed under the active region by ion implantation.

Referring to FIG. 2, a gate insulation film 4 of silicon dioxide is formed on the surface of the active region by thermal oxidation. Then a polysilicon film is grown on the entire surface of the silicon substrate 1 by chemical vapor deposition. Then the polysilicon film is patterned by the conventional photolithography technology so as to form a gate electrode (or a word line) 5. Thereafter, an impurity such as an arsenic (As) ion is implanted by the ion implantation process, in which the gate electrode is used as a mask film. Thereby, an $n^+$-type source region 6 and an $n^+$-type drain region 7 are formed in the silicon substrate 1. After that, formed are a memory capacitor constituted by a stacked capacitor which is in contact with the $n^+$-type drain region 7, and a bit line which is in contact with the $n^+$-type source region 6.

In the semiconductor memory device thus produced, a radiation such as the α-ray penetrates the silicon substrate 1 and produces electron-hole pairs. Electrons produced in a substrate portion under the $p^+$-type charge barrier layer 3 are prevented from being collected in the depletion regions and $n^+$-type source and drain regions 6 and 7. Therefore, the occurrence of soft errors can be reduced.

However, the conventional semiconductor memory device described above has the disadvantages described below. Normally, the $n^+$-type source and drain regions 6 and 7 are approximately 0.2 [μm] in depth. The vertical width of the depletion region formed under each of the source and drain regions 6 and 7 is smaller than the width of a depletion region of a channel formed under the gate electrode 5.

Figure 3A:
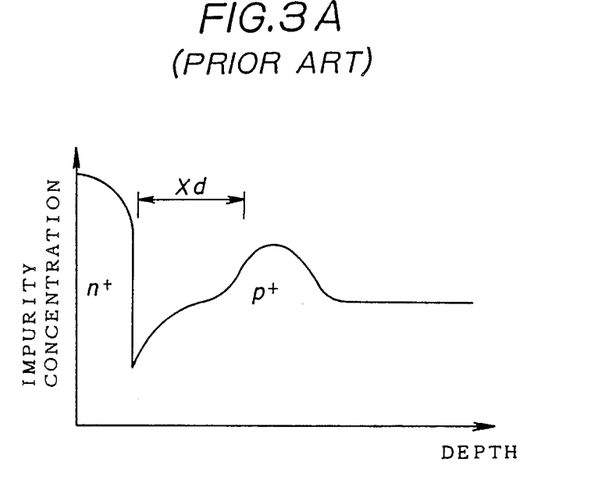
FIGS. 3A and 3B are graphs which illustrate disadvantages of a conventional DRAM device manufactured by the steps of FIGS.1 and 2.
Figure 3B:
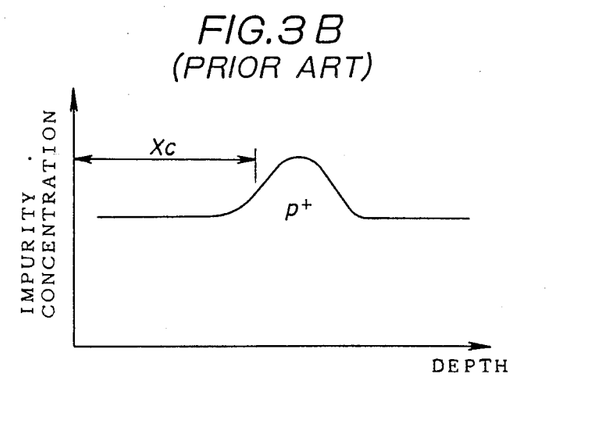

FIG.3A shows the impurity profile with respect to a silicon substrate portion including the source or drain region 6 or 7. FIG. 3B shows the impurity profile with respect to a silicon substrate portion under the gate electrode 5. In FIGS. 3A and 3B, the horizontal axes denote vertical depth from the surface of the silicon substrate 1, and the vertical axes denote impurity concentration. Xd is the width of the depletion region formed under the source or drain region 6 or 7, and Xc is the width of the depletion region of the channel region formed under the gate electrode 5.

As can be seen from FIGS. 3A and 3B, the width Xc of the depletion region is larger than the width Xd of the depletion region because of the presence of the source and drain regions 6 and 7. If the $p^+$-type charge barrier layer 3 is formed so as to have an optimum position determined based on the width Xd of the depletion regions under the source and drain regions 6 and 7, it is inevitable that the width Xc of the depletion region under the gate electrode 5 increases unnecessarily. It is noted that as the width Xc of the depletion region increases, more electrons are collected in the depletion region. Therefore, erroneous operation increases. As a result, the charge barrier layer 3 decreases in the charge preventing function. On the other hand, in a case where the position of the $p^+$-type charge barrier layer 3 is determined based on the width Xc of the depletion region, the width Xd of the depletion region under the source or drain region 6 or 7 exceeds a peak of the impurity concentration curve with respect to the $p^+$-type charge barrier layer 3. From this region, the charge preventing function of the $p^+$-type charge barrier layer 3 deteriorates.

The present invention intends to overcome the aforementioned disadvantages.

A description is given of a preferred embodiment of the present invention with reference to FIGS. 4 through 11, which show cross sections of a semiconductor memory device of the preferred embodiment of the present invention observed at different manufacturing steps. The semiconductor memory device described below is a DRAM device which has memory cells each consisting of a memory capacitor constituted by a stacked capacitor, and a transfer gate transistor constituted by a field effect transistor.

Figure 4:
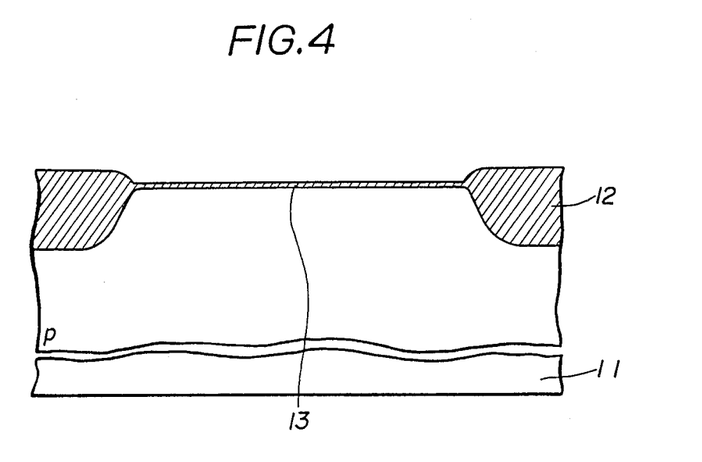
FIG. 4 through 11 are cross sectional views observed at different steps of a method of a preferred embodiment of the present invention.

Referring to FIG. 4, a field insulation film 12 of silicon dioxide is formed on a main surface of a silicon semiconductor substrate 11 by the selective thermal oxidation process in which an oxidation-resistant mask film (not shown) such as a silicon nitride film is used. Next, the silicon nitride film is removed in its entirety. A surface portion of the silicon substrate 11 which is exposed by the removal of the silicon nitride film, is subjected to thermal oxidation. Thereby, a gate insulation film 13 of silicon dioxide is formed to a thickness of approximately 200 [Å].

Figure 5:
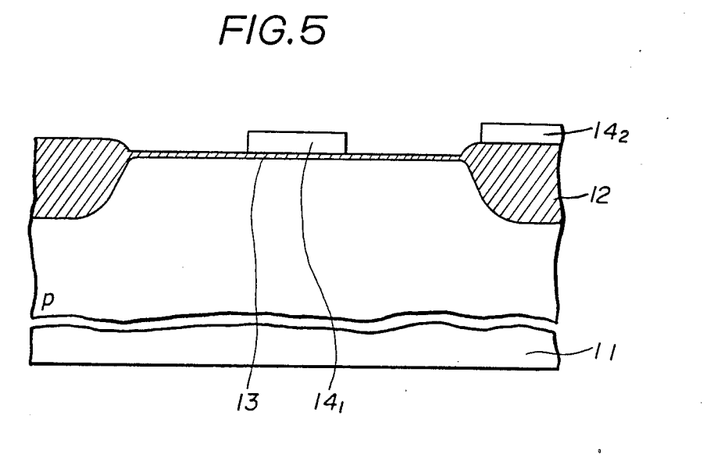

Referring to FIG. 5, a polysilicon film is grown to a thickness of approximately 0.2 [μm] by chemical vapor deposition. It is preferable that the polysilicon film is formed so as to have a thickness equal to or nearly equal to a depth of a source or drain region 16 or 17 shown in FIG. 7 described later. Thereafter, by a conventional thermal diffusion process in which a source gas of POCl$_3$ is used, phosphorus (P) ions are introduced so that the polysilicon film can be changed to an n$^+$-type polysilicon film. Then a mask film is deposited by the resist process of the conventional photolithography technology, and then the polysilicon film is subjected to the patterning process based on reactive ion etching (RIE). Thereby, gate electrodes (word lines) 14$_1$ and 14$_2$ are formed. The gate electrode 14$_1$ is associated with a transfer gate transistor having source and drain regions 16 and 17 shown in FIG. 7. The gate electrode 14$_2$ is associated with neighboring transfer gate transistor not shown.

Figure 6:
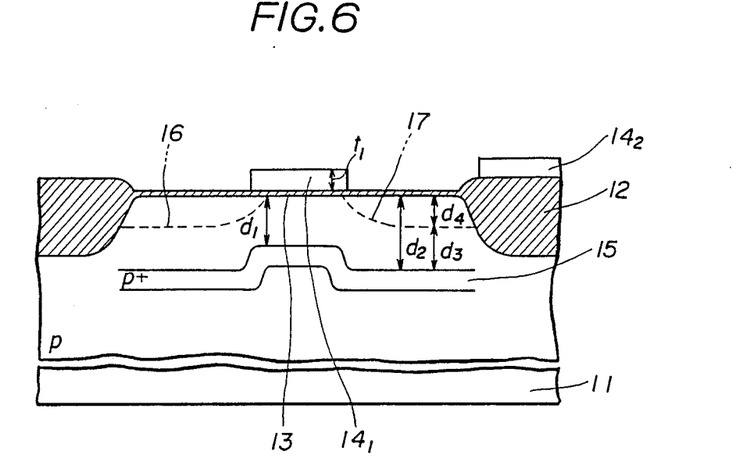

Referring to FIG. 6, by using the ion implantation process, boron (B) ions are implanted into the silicon substrate 11 through the entire surface thereof. Thereby, a p$^+$-type charge barrier layer 15 is formed as shown in FIG. 6. As is shown in FIG. 6, the p$^+$-type charge barrier layer 15 has a curved cross section, which is clearly distinct from the cross section of the p$^+$-type charge barrier layer 5 shown in FIG. 2. A depth d$_1$ of the charge barrier layer 15 under the gate electrode 14$_1$ measured from the surface of the silicon substrate 11 is smaller than the depth d$_2$ of the charge barrier layer 15 measured therefrom. In other words, under the gate electrode 14$_1$ of FIG. 6, the p$^+$-type charge barrier layer 15 is formed at a relative small depth d$_1$ from the surface of the silicon substrate 11. On the other hand, the p$^+$-type charge barrier layer 15 under the source or drain region 16 or 17 is formed at a relatively large depth d$_2$ from the surface of the silicon substrate 11. It is preferable that the width Xc of the depletion region under the gate electrode 14$_1$ is approximately identical to the width Xd of depletion regions under the source and drain regions 16 and 17. In other words, as shown in FIG. 6, it is preferable that the depth d$_1$ of the charge barrier layer 15 under the gate electrode 14$_1$ measured from the surface of the substrate 11 is identical or nearly identical to the depth d$_3$ of the charge barrier layer 15 from a bottom surface of the source or drain regions 16 or 17. The above can be achieved by forming the gate electrode 14$_1$ so as to having a thickness t$_1$ almost identical to a depth d$_4$ (=d$_2$−d$_3$) of the source or drain region 16 or 17. Essential parameters in the above-mentioned boron implantation process are shown below.

Acceleration energy: 500–1000 [KeV];
Dose amount: 4×10$^{12}$ [cm$^{-2}$];
Impurity concentration: 5×10$^{17}$ [cm$^{-3}$];
Depth d$_1$: ~0.7 [μm]; and
Depth d$_2$: ~0.9 [μm].

It is preferable that the impurity concentration of the p$^+$-type charge barrier layer 15 is in the order of 10$^{17}$ [cm$^3$] or over. It is further preferable that the dose of boron ions is 1×10$^{12}$ [cm$^{-2}$] or over. As described previously, the gate electrode 14$_1$ and 14$_2$ are doped with boron ions with an impurity concentration of greater than 1×10$^{13}$ [cm$^{-3}$]. For example, a dose of 1×10$^{13}$ [cm$^{-2}$] of boron ions corresponds to 5×10$^{17}$ [cm$^{-3}$](=1×10$^{13}$/2000 [Å]). As a result, even if boron ions are implanted with a dose of approximately 1×10$^{13}$ [cm$^{-2}$] after implantation of phosphorus ions with an impurity concentration of greater than 10$^{20}$ [cm$^{-3}$], a decrease in impurity concentration of the gate electrodes 14$_1$ and 14$_2$ resulting from the boron doping is negligible.

Figure 7:
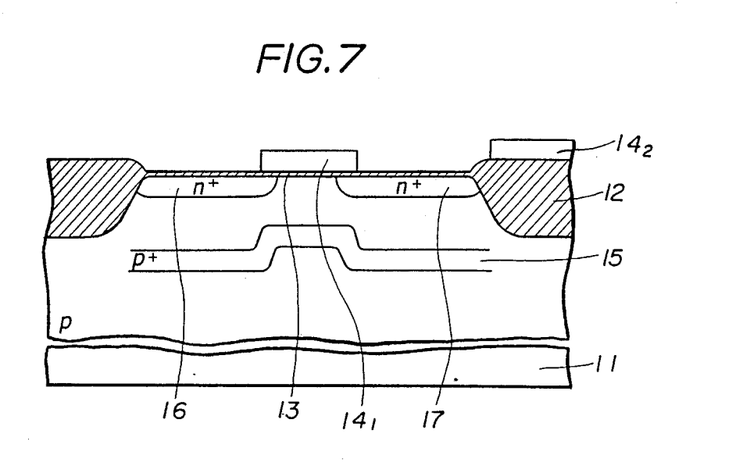

Thereafter, as shown in FIG. 7, arsenic (As) ions are implanted by ion implantation, and thereby the source and drain regions 16 and 17 are formed in the silicon substrate 11. The source and drain regions 16 and 17 are approximately 0.2 [μm] in depth.

Figure 8:
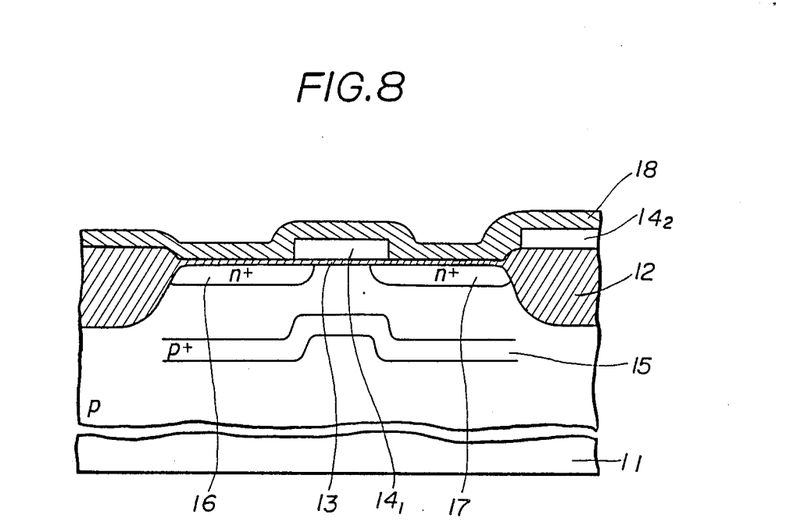

Referring to FIG. 8, an interlayer insulation film 18 of silicon dioxide is formed by chemical vapor deposition.

Figure 9:
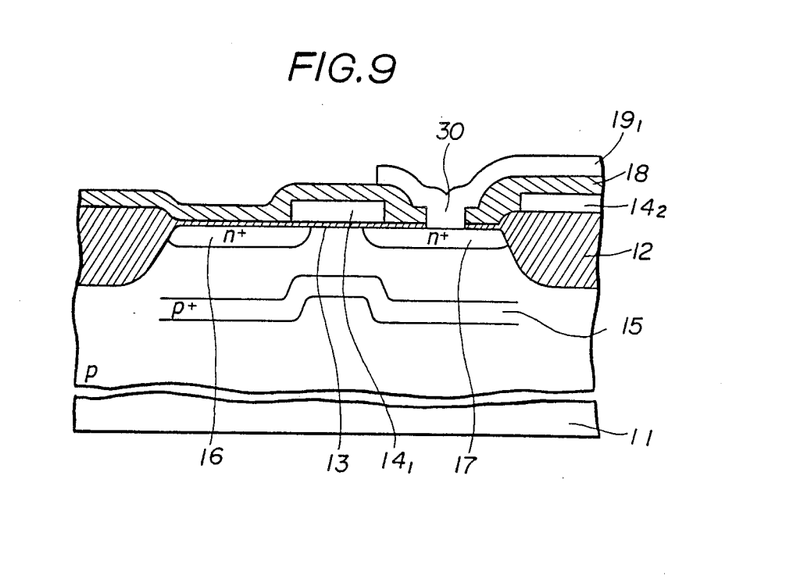

Referring to FIG. 9, the interlayer insulation film 18 is selectively etched by the conventional photolithography technology so as to form a storage electrode contact window 30 in the interlayer insulation film 18. Then a polysilicon film is deposited which is used for forming a storage electrode of a memory capacitor, which is paired with an opposed electrode (called cell plate). The deposition of the polysilicon film is carried out by chemical vapor deposition. Subsequently, by ion implantation, arsenic (As) ions are implanted into the polysilicon film to provide the polysilicon film with n$^+$-type conductivity. Then the n$^+$-type polysilicon film is patterned by the conventional photolithography technology so as to form a storage electrode 19$_1$.

Figure 10:
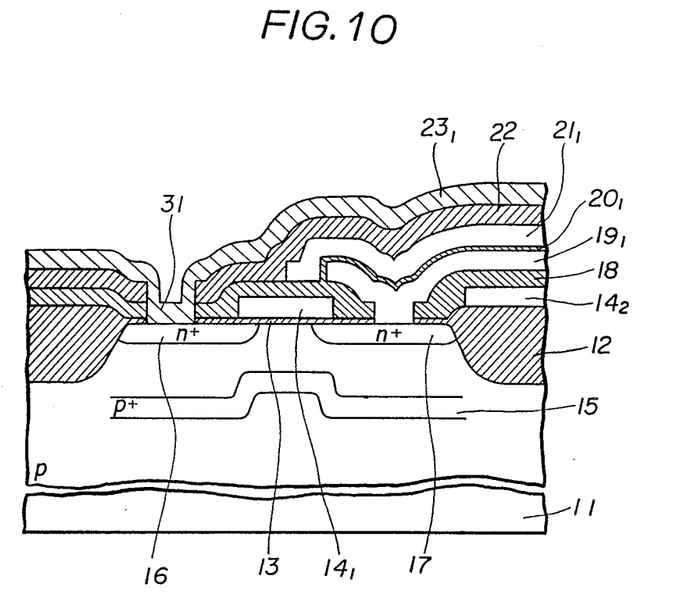

Referring to FIG. 10, a thin dielectric film 20$_1$ of silicon dioxide is formed on the surface of the storage electrode 19$_1$ by thermal oxidation. The dielectric film 20$_1$ is approximately 100 [Å] thick. Thereafter, a polysilicon film is deposited which is used for forming an opposed electrode (or a cell plate) of the memory cell. The deposition of the polysilicon film is carried out by chemical vapor deposition. The polysilicon film is approximately 2000 [Å] thick. Then by a conventional thermal diffusion process in which a source gas of POCl$_3$ is used, phosphorus are introduced into the polysilicon film so that it can be changed to an n$^+$-type polysilicon film. Thereafter, the polysilicon film is patterned by the conventional photolithography so that an opposed electrode 21$_1$ is formed. Then an interlayer insulation film 22 of silicon dioxide is formed by chemical vapor deposition. subsequently, the interlayer insulation film 22 and the gate insulation film 13 are selectively etched by the conventional photolithography technology so as to form a bit line contact window 31 in the interlayer insulation film 22 and the gate electrode insulation film 13. A portion of the surface of the source region 16 is exposed through the bit line contact window 31. Then a polysilicon film and a refractory metal silicide film are formed in this order by chemical vapor deposition and sputtering, respectively. Then the polysilicon film and the refractory metal silicide film are patterned so as to form a bit line 23$_1$ by the conventional photolithography technology.

Figure 11:
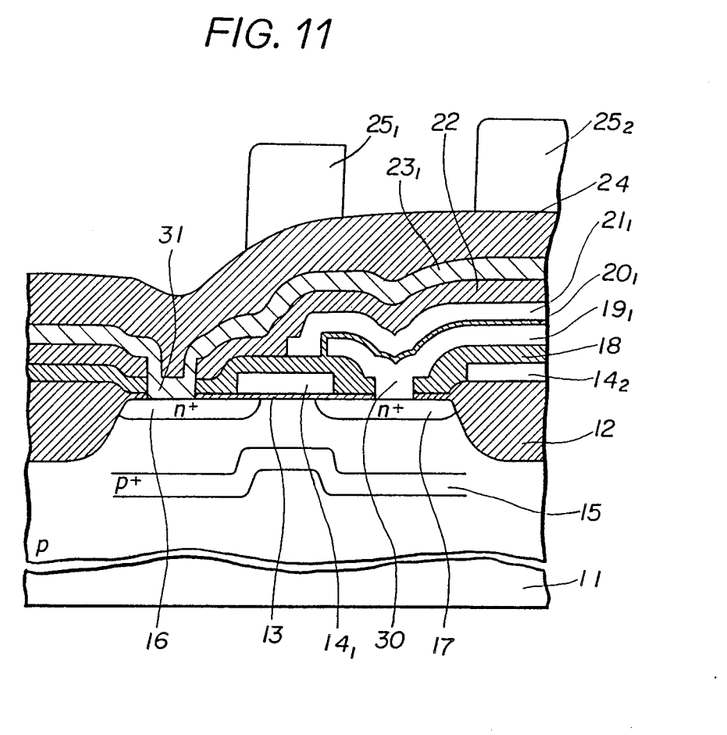

After that, as shown in FIG. 11, a passivation film 24 of phosphosilicate glass (PSG) is formed. Then an aluminum film which improves conductivity of the word lines 14$_1$ and 14$_2$ is formed and then patterned so that word lines 25$_1$ and 25$_2$ are formed.

According to the preferred embodiment of the present invention, the width Xc of the depletion region under the gate electrode 14$_1$ is made smaller than that of the depletion region under the gate electrode 5 in the conventional DRAM device. In other words, the depth d$_1$ of the charge barrier layer 15 under the gate electrode 14$_1$ is smaller than the depth d$_2$ of the charge barrier layer 15 under the source or drain region 16 or 17. As a result, the p$^+$-type charge barrier layer 15 is formed at a suitable depth under both the gate electrode 14$_1$ and source and drain regions 16 and 17. Therefore, the p$^+$-type charge barrier layer 15 has the improved function of preventing electrons from being collected in the depletion regions and the source and drain regions 16 and 17. The above function is enhanced in the case where the depth $d_1$ of the charge barrier layer 15 under the gate electrode $14_1$ is almost identical to the depth $d_3$ of the charge barrier layer 15 measured from the bottom surface of the source or drain region 16 or 17.

The present invention includes SRAM devices. That is, the similar advantageous effects are obtainable by providing the $p^+$-type charge barrier layer.

The present invention is not limited to the aforementioned embodiment, and variations and modifications may be made without departing from the scope of the present invention.

What is claimed is:

1. A semiconductor memory device comprising:
a semiconductor substrate having source and drain regions each having a conduction type opposite to that of the semiconductor substrate;
an insulation film formed on a main surface of the semiconductor substrate having first and second contact windows; and
a gate electrode formed on the insulation film so as to be located between the source and drain regions;
the semiconductor substrate having a charge barrier layer which has the same conduction type as the semiconductor substrate and has an impurity concentration higher than that of the semiconductor substrate;
the charge barrier layer being spaced apart from said main surface and formed so that a depth ($d_1$) of the charge barrier layer located under the gate electrode measured from the main surface of the semiconductor substrate is smaller than a depth ($d_2$) of the charge barrier layer located under the source and drain regions measured from the main surface of the semiconductor substrate.

2. A semiconductor memory device as claimed in claim 1, wherein the depth ($d_1$) of the charge barrier layer from the main surface of the semiconductor substrate under the gate electrode is identical or nearly identical to a depth ($d_3$) of the charge barrier layer from a bottom surface of each of the source and drain regions.

3. A semiconductor memory device as claimed in claim 1, wherein a thickness ($t_1$) of the gate electrode is identical or nearly identical to a depth ($d_4$) of each of the source and drain regions measured from the main surface of the semiconductor substrate.

4. A semiconductor memory device as claimed in claim 1, wherein the impurity concentration of the charge barrier layer is on the order of $10^{17}$ or over.

5. A semiconductor memory device as claimed in claim 1, wherein the depth ($d_1$) of the charge barrier layer under the gate electrode measured from the main surface of the semiconductor substrate is approximately 0.7.

6. A semiconductor memory device as claimed in claim 1, wherein the depth ($d_2$) the charge barrier layer located under the source and drain regions measured from the main surface the semiconductor substrate is approximately 0.9.

* * * * *

UNITED STATES PATENT AND TRADEMARK OFFICE
CERTIFICATE OF CORRECTION

PATENT NO. : 4,961,165
DATED : October 2, 1990
INVENTOR(S) : Taiji EMA

It is certified that error appears in the above-identified patent and that said Letters Patent is hereby corrected as shown below:

Col. 8, line 19, before "or" insert --[$cm^{-3}$]--;

line 24, after "0.7" insert --[$\mu m$]--;

line 29, after "0.9" insert --[$\mu m$].

Signed and Sealed this

Twenty-fourth Day of December, 1991

Attest:

HARRY F. MANBECK, JR.

*Attesting Officer*      *Commissioner of Patents and Trademarks*